United States Patent [19]

Weber

[11] Patent Number: 5,013,632

[45] Date of Patent: May 7, 1991

[54] PHOTOPOLYMER FILM FOR HOLOGRAPHY

[75] Inventor: Andrew M. Weber, Wilmington, Del.

[73] Assignee: E. I. Du Pont de Nemours and Company, Wilmington, Del.

[21] Appl. No.: 414,419

[22] Filed: Sep. 29, 1989

[51] Int. Cl.$^5$ .................. G03F 7/027; G03F 7/033
[52] U.S. Cl. ................................. 430/281; 430/1; 430/2; 430/910; 430/290; 522/121
[58] Field of Search .................. 430/1, 2, 281, 290, 430/910; 522/121

[56] References Cited

U.S. PATENT DOCUMENTS

| | | | |
|---|---|---|---|
| 4,535,052 | 8/1985 | Anderson et al. | 430/281 X |
| 4,942,102 | 7/1990 | Keys et al. | 430/1 |
| 4,942,112 | 7/1990 | Monroe et al. | 430/2 X |
| 4,950,567 | 8/1990 | Keys et al. | 430/1 |

Primary Examiner—Cynthia Hamilton

[57] ABSTRACT

Film speed of holographic photopolymer film containing polyvinyl acetate binder and an ethylenically unsaturated monomer is improved by including acrylic anhydride in the film.

4 Claims, No Drawings

PHOTOPOLYMER FILM FOR HOLOGRAPHY

FIELD OF THE INVENTION

This invention relates to refractive index imaging (holography), and, more particularly, to a photopolymer film that has excellent response to radiation used to record the image.

DISCUSSION OF THE BACKGROUND AND PRIOR ART

Materials capable of recording phase holograms, and particularly reflection holograms have received much recent attention for applications as diverse as graphic arts, optical coupling devices, head up displays, notch filters, and the like. Dichromated gelatin has been the material of choice for making holograms due to its high values of refractive index modulation (i.e., high diffraction efficiency) and wide bandwidth response. However, dichromated gelatin has poor shelf life and requires wet processing after the material has been imaged to contain a hologram. Dichromated gelatin also has poor shelf life, which necessitates preparation shortly before imaging or use of prehardened gelatin, which reduces image efficiency.

Photopolymer films have been proposed as an alternative for dichromated gelatin. U.S. Pat. No. 3,658,526 to Haugh, for instance, discloses preparation of stable, high resolution holograms from photopolymerizable films by exposure to a coherent light source. Materials disclosed by Haugh, however, offer only limited viewing response to visible radiation and applications are limited to transmission holograms where the image is viewed by light transmitted through the material. The materials have little or no reflection efficiency, and thus are not useful for important applications that utilize a reflection hologram.

Excellent photopolymer films, that may be used to record transmission or reflection holograms, have recently been disclosed in published EPO patent applications 89 100 495.4 and 89 100 498.8. These photopolymer films are imaged in conventional fashion by exposure to coherent light, and the holographic image is subsequently fixed by heating or flooding with light. Efficiency of the imaged film may be enhanced by various techniques disclosed in the applications.

SUMMARY OF THE INVENTION

It now has been found that film speed of certain photopolymer films is increased by adding acrylic anhydride to the film composition. The term "film speed" as used herein means the amount of energy required to attain greater than 90% reflection efficiency of the recorded hologram after thermal processing. Faster film speed not only allows increased manufacture rate, but also reduces the potential for producing a defective hologram due to equipment vibration during the imaging process. Accordingly, the present invention provides a photopolymer film for refractive index imaging consisting essentially of:

(a) approximately 25 to 90% of a polyvinyl acetate binder;
(b) acrylic anhydride in an amount effective to increase film speed;
(c) approximately 5 to 60% of an ethylenically unsaturated monomer;
(d) approximately 0 to 25% of a plasticizer; and
(e) approximately 0.1 to 10% of a photoinitiator;

wherein said percentages are weight percentages based on total film weight.

DETAILED DESCRIPTION OF THE INVENTION

The photopolymer film is substantially solid, transparent, and sufficiently flexible that it can be brought into intimate contact with the surface (e.g., a windshield, helmet visor or glass sheet) to which it ultimately will be mounted. Components of the film include a polyvinyl acetate binder, an ethylenically unsaturated monomer, acrylic anhydride, optionally a plasticizer and other ingredients conventionally used in photopolymer systems, and a photoinitiator system. Upon exposure to coherent light as described hereinafter, the monomer polymerizes to form higher molecular weight polymers having a different refractive index and rheological properties than the unexposed area of the film. Although the film is substantially solid, components interdiffuse before, during, and after the exposure to coherent light until they are fixed by a final uniform exposure to actinic radiation or by thermal treatment at elevated temperatures. The film typically has a thickness of approximately 1 to 100 micrometers. Thinner films generally will not achieve useful reflection efficiencies.

The film reflects radiation (e.g., light) having a spectral and angular bandwidth determined by the thickness and refractive index modulation of the film. Thus, the film thickness is matched to the optical requirements of the application and the optical system, i.e., the bandwidth of light that will be used to illuminate the hologram in use (the "display source"). In general, relatively thick films will be selected for narrow bandwidth applications, and relatively thin films will be selected for broad bandwidth applications. The polyvinyl acetate binder may be a homopolymer, or may contain comonomers, such as ethyl vinyl ether, that modify chemical and mechanical properties of the film, such as solubility, compatibility, adhesion, flexibility, or hardness.

Inclusion of acrylic anhydride in the specified composition serves to increase film speed for reasons that are not understood. Similar results have not been achieved using propionic anhydride or unsaturated anhydrides such as methacrylic and cinnamic anhydride. Also, the film speed has not been observed to improve when acrylic anhydride was added to a composition using polyvinyl butyral as the binder.

USEFUL MONOMERS

The film contains at least one ethylenically unsaturated monomer that is capable of free radical initiated addition polymerization, has a boiling point above 100° C., and is compatible with the coating solvent and selected binder. The monomer usually will contain the unsaturated group in the terminal position. A liquid monomer will generally be selected, but solid monomers can be used to advantage, generally in combination with one or more liquid monomers, provided the solid monomer is capable of interdiffusion in the substantially solid film composition.

A preferred class of monomers for use in the compositions of this invention are liquid, ethylenically unsaturated compounds capable of addition polymerization and having a boiling point above 100° C., which contain one or more moieties taken from the group consisting of a substituted or unsubstituted phenyl, biphenyl, phenoxy, naphthyl, naphthyloxy, and heteroaromatic groups containing up to three aromatic rings; chlorine; and bromine. The monomer contains at least one such moiety and may contain two or more of the same or different moieties of the group, provided the monomer remains liquid. Substituted groups, such as lower alkyl, alkoxy, phenyl, phenoxy, carboxy, carbonyl, cyano, chloro, bromo or combinations thereof, may be present provided that the monomer remains liquid and diffusable in the photopolymerizable layer. Representative liquid monomers include: 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, and mixtures thereof.

While most monomers useful in this invention are liquids, they may be used in admixture with one or more ethylenically unsaturated solid monomers such as the ethylenically unsaturated carbazole monomers disclosed in H. Kamogawa, et al., *Journal of Polymer Science: Polymer Chemistry Edition*, Vol. 18 (1979), pp. 9-18; 2-naphthyl acrylate; pentachlorophenyl acrylate; 2,4,6-tribromophenyl acrylate; 2-(2-naphthyloxy)ethyl acrylate; N-phenyl maleimide; p-biphenyl methacrylate; 2-vinylnaphthalene; 2-naphthyl methacrylate; N-phenyl methacrylamide; and t-butylphenyl methacrylate.

Ethylenically unsaturated carbazole monomers containing a vinyl group attached to the nitrogen atom of the carbazole moiety typically are solids. Suitable monomers of this type include N-vinyl carbazole and 3,6-dibromo-9-vinyl carbazole. A particularly preferred mixture of ethylenically unsaturated monomers comprises N-vinyl carbazole in combination with one or more of the above liquid monomers, in particular, with 2-phenoxyethyl acrylate, phenol ethoxylate monoacrylate, ethoxylated bisphenol A diacrylate, or mixtures thereof.

If crosslinking of the photopolymer is desired, up to about five weight percent of at least one multifunctional monomer containing two or more terminal ethylenically unsaturated groups may be incorporated into the composition. The polyfunctional monomer must be compatible with the other components of the composition and is preferably a liquid. Suitable multifunctional monomers include di-(2-acryloxyethyl)ether of bisphenol A, ethoxylated bisphenol A diacrylate, triethylene glycol diacrylate, trimethylol propane triacrylate, and the like. A preferred crosslinking for use in the compositions of this invention is ethoxylated bisphenol A diacrylate.

PHOTOINITIATOR SYSTEM

The initiator system comprises one or more compounds which directly furnish free-radicals when activated by actinic radiation. By "actinic radiation" is meant radiation which is active to produce the free-radicals necessary to initiate polymerization of the monomeric material. It can also comprise a plurality of compounds, one of which yields the free-radicals after having been caused to do so by another compound, or sensitizer, which is activated by the radiation. Photoinitiator systems useful in practicing this invention typically will contain a photoinitiator and a sensitizer which extends the spectral response into the near ultraviolet, the visible, and/or near infrared spectral regions.

Preferred initiator systems are 2,4,5-triphenylimidazolyl dimers with chain transfer agents, or hydrogen donors, and mixtures thereof, sensitized by visible sensitizers. Preferred 2,4,5-triphenylimidazolyl dimers include CDM-HABI, i.e., 2-(o-chlorophenyl)-4,5-bis(m-methoxyphenyl)-imidazole dimer; o-Cl-HABI, i.e., 1,1'-biimidazole, 2,2'-bis(o-chlorophenyl)-4,4',5,5'-tetraphenyl-; and TCTM-HABI, i.e., 1H-imidazole, 2,5-bis(o-chlorophenyl)-4-[3,4-dimethoxyphenyl]-, dimer, each of which is typically used with a hydrogen donor.

A preferred group of sensitizers include the bis(p-dialkylaminobenzylidine) ketones disclosed in Baum and Henry, U.S. Pat. No. 3,652,275 and the arylyidene aryl ketones disclosed in Dueber, U.S. Pat. No. 4,162,162. Particularly preferred sensitizers include the following: DEAW, i.e., cyclopentanone, 2,5-bis[4-(diethylamino)phenyl]-methylene]-; and JAW, i.e., cyclopentanone, 2,5-bis[(2,3,6,7-tetrahydro-1H,5H-benzo[i,j]quinolizin-1-yl)methylene]-. Other particularly useful sensitizers are cyclopentanone, 2,5-bis[2-(1,3-dihydro-1,3,3-trimethyl-2H-indol-2-yli dene)ethylidene], CAS 27713-85-5; and cyclopentanone, 2,5-bis-[2-ethylnaphtho[1,2-d]thiazol-2(1H)-ylidene)ethylidene], CAS 27714-25-6.

Suitable hydrogen donors include: 2-mercaptobenzoxazole, 2-mercaptobenzothiazole, 4-methyl-4H-1,2,4-triazole-3-thiol, and the like. Other suitable hydrogen donor compounds, which are preferred for compositions which contain N-vinyl carbazole monomer, are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

OTHER COMPONENTS

Other components conventionally added to photopolymer compositions can be present to modify the physical properties of the film. Such components include: plasticizers, thermal stabilizers, optical brighteners, ultraviolet radiation stabilizers, adhesion modifiers, coating aids, and release agents.

A plasticizer may be present to modify adhesion, flexibility, hardness, and other mechanical properties of the film in a conventional fashion. Candidate plasticizers include triethylene glycol dicaprylate, triethylene glycol bis(2-ethylhexanoate), tetraethylene glycol diheptanoate, diethyl sebacate, and dibutyl suberate. Other plasticizers that yield equivalent results will be apparent to those skilled in the art. It will also be appreciated that a mixture of plasticizer and solid monomer may be used, provided that the mixture of plasticizer and monomer remains liquid.

A thermal polymerization inhibitor normally will be present to improve the storage stability of the composition. Useful thermal stabilizers include: hydroquinone, phenidone, p-methoxyphenol, alkyl and aryl-substituted hydroquinones and quinones, t-butyl catechol, pyrogallol, beta-naphthol, 2,6-di-t-butyl-p-cresol, phenothiazine, and chloranil. Since monomers usually contain thermal polymerization inhibitors added by their manufacturers, it may not be necessary to add additional inhibitor.

Nonionic surfactants may be added to the photopolymerizable composition as coating aids. Preferred coating aids are fluorinated nonionic surfactants, such as Fluorad ® FC-430 and Fluorad ® FC431.

Useful optical brighteners include those disclosed in Held, U.S. Pat. No. 3,854,950. An representative optical brightener is 7-(4'-chloro-6'-diethylamino-1',3',5'-triazine-4'-yl) amino 3-phenyl coumarin. Ultraviolet radiation absorbing materials useful in the invention are also disclosed in Held, U.S. Pat. No. 3,854,950.

FILM COMPOSITION

Proportions of ingredients in the photopolymer composition generally will be within the following percentage ranges, based on total weight of the composition: polyvinyl acetate binder, 25 to 90%, preferably 45 to 75%; acrylic anhydride, 0.5 to 5%, preferably 2 to 4%; monomer, 5 to 60%, preferably 15 to 50%; plasticizer, 0 to 25%, preferably 0 to 15%; photoinitiator system, 0.1 to 10%, preferably 1 to 7%; and optional ingredients, 0 to 5%, typically 1 to 4%. If the amount of binder is below approximately 25%, or the amount of monomer exceeds approximately 60%, the composition has insufficient viscosity to form a solid film. The presence of binder is held within approximately 90% since performance is unduly lost at higher levels of addition, and resulting films have diminished values of refractive index modulation. Likewise, levels of monomer used will be at least approximately 5% since lower quantities will not produce films having practical values of refractive index modulation.

In practicing the invention, the photosensitive composition is first cast, laminated, or more preferably, spin coated onto a transparent support that provides structural integrity for the composition (referred to herein as a film) as it is processed. Since the photosensitive film typically will be only 1 to 100 micrometers in thickness, the support is necessary to prevent film rupture or any stretching during processing that would affect spacing of the interference fringes created in the film that form the holographic image. The transparent support must have sufficient optical quality that it does not unduly absorb or scatter coherent light passing through it during formation of the hologram. Also, the support generally will be sufficiently flexible that it will not separate from the film as the film is brought into contact with its permanent mounting surface, such as a curved substrate (e.g., a windshield or helmet visor). Less, if any, flexibility will be needed if the permanent mounting surface is planar, such as a sheet of glass. Exemplary transparent supports that may be selected to advantage include polyethylene terephthalate film, polymethyl methacrylate, polycarbonate, and cellulose triacetate.

For some applications it may be desired to retain the support as a permanent overcoat or protective layer for the photopolymer film, in which case the support and photopolymer film may be permanently bonded. The other side of the supported photopolymer film may have a temporary protective cover sheet, such as a polyethylene or polypropylene film, releasably adhered thereto. Conventional intermediate layers or coatings may be used to facilitate the adhesive and/or release characteristics desired for a particular application.

After the photopolymer film has been imaged to contain a reflection hologram, employing techniques well known in the art, the film generally will be heated to a temperature above 50° C., and preferably between 80° and 160° C. to enhance performance. Two to three fold improvements in refractive index modulation are readily achieved. Thermal enhancement treatment may be carried out either before or after the image is fixed by flooding the film with actinic radiation as described above, but typically it is carried out after the fixing step. The thermal treatment may concurrently fix the enhanced hologram by thermally hardening or polymerizing the photopolymerizable material in the hologram. Both the rate of thermal enhancement and the rate of thermal hardening increase with increasing temperature, with most of the benefits being achieved during early stages. For example, when using a 100° C. enhancement temperature most of the enhancement occurs during the first 5 to 10 minutes, with little further improvement occurring after one hour.

It also has been found that optical properties of the hologram, such as diffraction and reflection efficiency, tend to be stabilized against degradation over time if the film is treated with a solution containing liquid monomer after the reflection hologram has been formed. In this treatment the film surface is exposed to the liquid monomer solution by immersion, spraying, or similar techniques to allow the monomer to be absorbed into the film. The monomer may be the same monomer contained in the film composition, or a different liquid monomer. The film is then dried, and the absorbed monomer is polymerized by exposing the film to actinic radiation such as ultraviolet or visible light. This treatment not only has a stabilizing effect on the optical properties, but also affects the spacing between interference fringe planes, thereby causing the holographic mirror to reflect a longer wavelength of light. Reflection efficiency also may be affected. Thus, through the selection of particular liquid monomers, carrying solvent, and soak time before polymerization it is possible to permanently modify the optical properties of the film.

If desired, the film may contain a relatively volatile agent during the imaging step, which is subsequently removed after imaging. In this embodiment the spacing between the fringes of the holographic mirror is reduced when the agent is removed, causing the film to reflect shorter wavelength radiation than was used to form the mirror. This effect can be achieved by the selection of solvents or plasticizers that are compatible with the selected film composition, and which can be removed by evaporation or during heat processing of the film.

The wavelength of response may be shifted by diffusing a nonvolatile plasticizer or monomer into the imaged and processed hologram. The is conveniently carried out by laminating a diffusion element containing binder and monomer and/or plasticizer to the film containing the imaged and processed hologram and allowing diffusion to take place. The diffusion element may be a piece of unexposed film or it may contain monomers and/or plasticizers. The laminated film and diffusion element may be heated during diffusion or diffusion may be carried out at room temperature. To stop diffusion, the diffusion element may be removed after diffusion or, if it is desired that diffusion go to equilibrium, it may be left in place. If the diffusion element contains a monomer, diffusion may be stopped by heating the laminate and/or exposing it to actinic radiation.

The photopolymer films of this invention are used in a variety of applications. Holograms can be used in displays as, for example, in advertising or packaging; in security applications as, for example, on credit cards, bank notes, lottery tickets, and the like; for information storage; and in head up displays and the like.

EXAMPLES

The invention will now be further illustrated by reference to the following examples, in which copolymer compositions are given as percent by weight.

| GLOSSARY | |
|---|---|
| AA | Acrylic anhydride |
| DEAW | Cyclopentanone, 2,5-bis[[4-(diethylamino)-2-methylphenyl]methylene]-; CAS 11114-17-3; |
| FC-430 | Fluorad ® FC-430, liquid nonionic surfactant; fluoroaliphatic polymeric esters; CAS 11114-17-3; 3M Company |
| FC-431 | Fluorad ® FC-431, liquid nonionic surfactant; 50% solution of fluoroaliphatic polymeric esters in ethyl acetate; 3M Company |
| JAW | Cyclopentanone, 2,5-bis[(2,3,6,7-tetrahydro-1H,5H-benzo[i,j]quinolizin-1-yl)methylene]- |
| MMT | 4-Methyl-4H-1,2,4-triazole-3-thiol; CAS 24854-43-1 |
| NVC | N-Vinyl carbazole; 9-vinyl carbazole; CAS 1484-13-5 |
| o-Cl-HABI | 1,1'-Biimidazole, 2,2'-bis[o-chlorophenyl]-4,4',5,5'-tetraphenyl-; CAS 1707-68-2 |
| Photomer ® 4039 | Phenol ethoxylate monoacrylate; CAS 56641-05-5; Henkel Process Chemical Company |
| Sartomer 349 | Ethoxylated bisphenol A diacrylate; CAS 24447-78-7; Sartomer Company, West Chester, PA. |
| Vinac ® B-100 | Poly(vinyl acetate); M.W. 350,000; CAS 9003-20-7; Air Products; |

GENERAL PROCEDURES

Film Preparation

Coating solutions without sensitizing dyes were prepared in amber bottles under yellow or red light by adding the components to the solvents while mixing with a mechanical stirrer until completely dissolved. All components were used as received from the suppliers without further purification. The sensitizing dyes, DEAW and JAW, were added under red light and all subsequent operations on solutions and their resulting films were performed under red light only. It should by understood that "total solids" refers to the total amount of non-volatile components in the composition even though some of the components may be non-volatile liquids rather than solids at room temperature.

A Talboy coater equipped with a 250 micron doctor knife, 3.7M drier set at 40°-50° C., and a laminator station was used to coat the solutions onto a 100 micron thick clear film support of polyethylene terephthalate (Mylar ® polyethylene terephthalate film). A coversheet of 23 micron polyethylene terephthalate was laminated to the coatings as they emerged from the drier. Coating samples were stored in black polyethylene bags at room temperature until used.

Sample Evaluation

Coated film with both the film support and coversheet intact was cut into 10×13 cm sections and sandwiched between a clear glass plate and the front surface of an aluminum mirror. A thin layer of xylene was used to optically couple the glass and mirror to the film. Holographic mirrors were recorded in the film by exposing with a collimated 488 nm argon-ion laser beam orientated perpendicular to the film surface so that the beam traveled through the glass plate, xylene, polyethylene terephthalate coversheet, coating, and polyethylene terephthalate support, and xylene, and then was reflected back by the mirror through the xylene, polyethylene terephthalate support, coating, polyethylene terephthalate coversheet, xylene, and glass plate. In all cases, the laser beam had an intensity of 10 mW/cm$^2$, and a diameter of 2-3 cm. Sixteen images with varying exposure times were made on each film.

After laser exposure, the glass and mirror were removed and the film was overall exposed to ultraviolet and visible light using the output of a Theimer-Strahler #5027 mercury-arc photopolymer lamp (Exposure Systems Corp., Bridgeport, Conn.) mounted in a Douthitt DCOP-X (Douthitt Corp., Detroit, Mich.) exposure unit. The coating was thermally processed at 100° C. for 30 min in a forced-air convection oven.

The transmission spectrum of each holographic image was recorded from 400-700 nm using a Perkin Elmer model Lambda-9 spectrophotometer. The maximum reflection efficiency was determined from the transmission spectra. Film speed is defined as the amount of energy required to attain greater than 90% reflection efficiency after thermal processing.

EXAMPLES 1-5

These examples shows the affect of acrylic anhydride (AA) on film speed.

The compositions shown in Tables 1 and 2 were coated onto polyethylene terephthalate, exposed, processed, and evaluated as described in the general procedures. Reflection efficiency after processing as a function of exposure is given in Tables 3 and 4.

TABLE 1

| Component (gm) | Examples | | | | | |
|---|---|---|---|---|---|---|
| (% by weight)$^a$ | 1 | | 2 | | 3 | |
| AA | 0 | (0) | 0.26 | (1.0) | 0.51 | (2.0) |
| Vinac ® B-100 | 16.7 | (66.2) | 16.9 | (65.6) | 16.7 | (64.9) |
| Photomer ® 4039 | 4.25 | (16.8) | 4.30 | (16.7) | 4.23 | (16.5) |
| NVC | 2.00 | (7.9) | 2.01 | (7.8) | 1.98 | (7.7) |
| Sartomer 349 | 0.76 | (3.0) | 0.77 | (3.0) | 0.76 | (2.9) |
| MMT | 0.54 | (2.1) | 0.54 | (2.1) | 0.53 | (2.1) |
| o-Cl HABI | 0.93 | (3.7) | 0.94 | (3.6) | 0.93 | (3.6) |
| FC-430 | 0.056 | (0.2) | 0.057 | (0.2) | 0.056 | (0.2) |
| DEAW | 0.0077 | (0.03) | 0.0078 | (0.03) | 0.0077 | (0.03) |
| Solvents (mL) | | | | | | |
| Methylene Chloride | 114 | | 116 | | 114 | |
| Methanol | 3.5 | | 3.6 | | 3.5 | |

TABLE 1-continued

| Component (gm) | Examples | | |
|---|---|---|---|
| (% by weight)[a] | 1 | 2 | 3 |
| Thickness (microns) | 28.5 | 30.1 | 29.8 |

[a] % by weight total solids in the composition.

TABLE 2

| Component (gm) | Examples | | | |
|---|---|---|---|---|
| (% by weight)[a] | 4 | | 5 | |
| AA | 0.82 | (3.1) | 0.99 | (3.8) |
| Vinac ® B-100 | 16.8 | (64.2) | 16.6 | (63.6) |
| Photomer ® 4039 | 4.26 | (16.3) | 4.26 | (16.3) |
| NVC | 1.99 | (7.6) | 1.98 | (7.6) |
| Sartomer 349 | 0.76 | (2.9) | 0.76 | (2.9) |
| MMT | 0.54 | (0.21) | 0.53 | (2.0) |
| o-Cl HABI | 0.93 | (3.6) | 0.93 | (3.6) |
| FC-430 | 0.056 | (0.22) | 0.055 | (0.2) |
| DEAW | 0.0078 | (0.03) | 0.0074 | (0.03) |
| Solvents (mL) | | | | |
| Methylene Chloride | 115 | | 115 | |
| Methanol | 3.6 | | 3.6 | |
| Thickness (microns) | 31.1 | | 30.4 | |

[a] % by weight total solids in the composition.

TABLE 3

| | Reflection Efficiency (%) | | |
|---|---|---|---|
| Exposure (mJ/cm2) @ 488 nm | Example 1 (0% AA) | Example 2 (1.0% AA) | Example 3 (2.0% AA) |
| 11 | 13 | 56 | 52 |
| 15 | 41 | 72 | 71 |
| 19 | 62 | 84 | 90 |
| 25 | 76 | 92 | 92 |
| 32 | 75 | 96 | 96 |
| 42 | 88 | —a | — |
| 55 | 96 | — | — |
| 271 | 98.7 | 99.3 | 96.1 | a indicates the value was not determined.

TABLE 4

| | Reflection Efficiency (%) | |
|---|---|---|
| Exposure (mJ/cm2) @ 488 nm | Example 4 (3.1% AA) | Example 5 (3.8% AA) |
| 11 | 81 | 74 |
| 15 | 91 | 87 |
| 19 | 96 | 95 |
| 25 | 97 | 97 |
| 32 | 97 | 96 |
| 271 | 98.0 | 98.2 |

EXAMPLES 6-7

These examples illustrates the use of JAW as a sensitizer for a composition containing acrylic anhydride. The solutions in Table 5 were prepared, coated, and exposed as described in the general procedures except that an 200 micron doctor knife was used to coat the film and the laser imaging wavelength was 514 nm instead 488 nm. The coversheet was removed and the film was laminated to a 10×13 cm glass plate. A thin layer at xylene was used to optically couple the film to the mirror. Holographic mirrors were recorded in the film by exposing with a collimated 514 nm argonion laser beam oriented perpendicular to film surface so that the beam traveled through the glass plate, coating, PET, support, xylene, and then was reflected back by the mirror through the xylene, PET support, coating and glass plate. Reflection efficiency as a function of exposure is shown in Table 6.

TABLE 5

| Component (gm) | Examples | | | |
|---|---|---|---|---|
| (% by weight)[a] | 6 | | 7 | |
| AA | 0 | (0) | 1.20 | (2.91) |
| JAW | 0.032 | (0.08) | 0.032 | (0.08) |
| FC-431 | 0.16 | (0.40) | 0.16 | (0.39) |
| MMT | 1.20 | (2.99) | 1.20 | (2.91) |
| o-Cl HABI | 1.20 | (2.99) | 1.20 | (2.91) |
| Sartomer 349 | 1.20 | (2.99) | 1.20 | (2.91) |
| NVC | 3.60 | (8.98) | 3.60 | (8.72) |
| Photomer ® 4039 | 6.80 | (16.96) | 6.80 | (16.47) |
| Vinac ® B-100 | 25.9 | (64.60) | 25.9 | (62.72) |
| Solvents (mL) | | | | |
| Methanol | 8.0 | | 8.0 | |
| Dichloromethane | 152.0 | | 152.0 | |

[a] % by weight total solids in the composition; coated with an 8-mil knife (200 micron) giving a film thickness at 25 ± 2 microns.

TABLE 6

| | Reflection Efficiency (%)[a] | |
|---|---|---|
| Exposure (mJ/cm2) @ 514 nm | Example 6 (0% AA) | Example 7 (2.9% AA) |
| 4 | 46.6 | 87.4 |
| 5 | 79.1 | 90.5 |
| 6 | 90.8 | 97.5 |
| 8 | 92.0 | 96.4 |
| 11 | 95.3 | 99.4 |
| 14 | 98.8 | 99.2 |
| 18 | 99.5 | 99.3 |
| 24 | 99.9 | 97.3 |
| 41 | 98.7 | 98.5 |
| 118 | 98.7 | 99.8 |

[a] Films were laminated to glass before imaging.

What is claimed is:

1. A photopolymer film for refractive index imaging consisting essentially of:
   (a) approximately 25 to 90% of a polyvinyl acetate binder;
   (b) acrylic anhydride in an amount effective to increase film speed;
   (c) approximately 5 to 60% of an ethylenically unsaturated monomer;
   (d) approximately 0 to 25% of a plasticizer; and
   (e) approximately 0.1 to 10% of a photoinitiator;
   wherein said percentages are weight percentages based on total film weight.

2. The film of claim 1 containing approximately 0.5% to 5% by weight acrylic anhydride.

3. The photopolymer film of claim 2 wherein the binder is a polyvinyl acetate homopolymer.

4. The photopolymer film of claim 2 wherein said monomer is selected from the group consisting of 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, and mixtures thereof.

* * * * *